(12) United States Patent
Shimada et al.

(10) Patent No.: US 11,333,243 B2
(45) Date of Patent: May 17, 2022

(54) ROTARY ACTUATOR

(71) Applicant: DENSO CORPORATION, Kariya (JP)

(72) Inventors: Kazunori Shimada, Kariya (JP); Mikine Kume, Kariya (JP); Hiroyuki Kado, Kariya (JP); Shinji Naito, Kariya (JP)

(73) Assignee: DENSO CORPORATION, Kariya (JP)

( * ) Notice: Subject to any disclaimer, the term of this patent is extended or adjusted under 35 U.S.C. 154(b) by 74 days.

(21) Appl. No.: 16/847,992

(22) Filed: Apr. 14, 2020

(65) Prior Publication Data

US 2020/0340579 A1 Oct. 29, 2020

(30) Foreign Application Priority Data

Apr. 24, 2019 (JP) .............................. JP2019-083235

(51) Int. Cl.
| | |
|---|---|
| *F16H 61/32* | (2006.01) |
| *H02K 7/116* | (2006.01) |
| *H05K 7/14* | (2006.01) |
| *F16H 63/34* | (2006.01) |
| *H02K 11/21* | (2016.01) |
| *F16H 1/32* | (2006.01) |

(52) U.S. Cl.
CPC ............... *F16H 61/32* (2013.01); *F16H 1/32* (2013.01); *F16H 63/3466* (2013.01); *H02K 7/116* (2013.01); *H02K 11/21* (2016.01); *H05K 7/1401* (2013.01); *F16H 2061/326* (2013.01)

(58) Field of Classification Search
CPC ........ F16H 61/32; F16H 1/32; F16H 63/3466; F16H 2061/326; F16H 57/031; F16H 61/0006; F16H 2057/02026; F16H 59/08; F16H 2001/327; H02K 7/116; H02K 11/21; H02K 5/1732; H02K 11/215; H02K 2211/03; H02K 11/33; H02K 7/14; H02K 19/02; H02K 7/10; H02K 11/30; H05K 7/1401; H05K 5/06
See application file for complete search history.

(56) References Cited

U.S. PATENT DOCUMENTS

2013/0234548 A1 * 9/2013 Oishi ..................... H02K 5/225
310/71

FOREIGN PATENT DOCUMENTS

| JP | 2008-235473 | 10/2008 |
|---|---|---|
| JP | 4697163 | 6/2011 |
| JP | 5566357 | 8/2014 |

OTHER PUBLICATIONS

U.S. Appl. No. 16/847,953, to Kume, et al., entitled: "Rotary Actuator", filed Apr. 14, 2020 (18 pages).
U.S. Appl. No. 16/847,974, to Kannou, et al., entitled: "Rotary Actuator", filed Apr. 14, 2020 (22 pages).

(Continued)

*Primary Examiner* — Victor L MacArthur
(74) *Attorney, Agent, or Firm* — Nixon & Vanderhye P.C.

(57) ABSTRACT

A rotary actuator is used in a shift-by-wire system for a vehicle. The actuator includes a motor, a case, a controller, a cover, and a cover fixing member. The case houses the motor. The controller is disposed in an opening of the case and controls the motor. The cover closes the opening of the case. The cover fixing member fixes the cover to the case. The cover fixing member fixes the cover to the case at a position outside of a board of the controller. The board is clamped between the cover and the case.

9 Claims, 7 Drawing Sheets

(56) References Cited

OTHER PUBLICATIONS

U.S. Appl. No. 16/847,989, to Kume, et al., entitled: "Rotary Actuator", filed Apr. 14, 2020 (20 pages).
U.S. Appl. No. 16/847,788 to Kume, et al., entitled: "Rotary Actuator", filed Apr. 14, 2020 (22 pages).
U.S. Appl. No. 16/847,801, to Kume, et al., entitled: "Rotary Actuator", filed Apr. 14, 2020 (26 pages).
U.S. Appl. No. 16/847,820, to Kato, et al., entitled: "Rotary Actuator and Method for Manufacturing the Same", filed Apr. 14, 2020 (26 pages).
U.S. Appl. No. 16/847,854, to Naitou, et al., entitled: "Rotary Actuator", filed Apr. 14, 2020 (23 pages).
U.S. Appl. No. 16/847,816, to Imai, et al., entitled: "Rotary Actuator", filed Apr. 14, 2020 (27 pages).
U.S. Appl. No. 16/848,024, to Shimada, et al., entitled: "Rotary Actuator", filed Apr. 14, 2020 (18 pages).
U.S. Appl. No. 16/847,835, to Kannou, et al., entitled: "Rotary Actuator", filed Apr. 14, 2020 (18 pages).
U.S. Appl. No. 16/847,953, filed Apr. 14, 2020, Rotary Actuator.
U.S. Appl. No. 16/847,974, filed Apr. 14, 2020, Rotary Actuator.
U.S. Appl. No. 16/847,989, filed Apr. 14, 2020, Rotary Actuator.
U.S. Appl. No. 16/847,788, filed Apr. 14, 2020, Rotary Actuator.
U.S. Appl. No. 16/847,801, filed Apr. 14, 2020, Rotary Actuator.
U.S. Appl. No. 16/847,820, filed Apr. 14, 2020, Rotary Actuator and Method of Manufacturing the Same.
U.S. Appl. No. 16/847,854, filed Apr. 14, 2020, Rotary Actuator.
U.S. Appl. No. 16/847,816, filed Apr. 14, 2020, Rotary Actuator.
U.S. Appl. No. 16/847,992, filed Apr. 14, 2020, Rotary Actuator.
U.S. Appl. No. 16/848,024, filed Apr. 14, 2020, Rotary Actuator.
U.S. Appl. No. 16/847,835, filed Apr. 14, 2020, Rotary Actuator.

\* cited by examiner

ROTARY ACTUATOR

CROSS REFERENCE TO RELATED APPLICATIONS

This application is based on Japanese Patent Application No. 2019-083235 filed on Apr. 24, 2019, all of which is incorporated herein by reference.

TECHNICAL FIELD

The present disclosure relates to a rotary actuator.

BACKGROUND

Conventionally, when a circuit board is housed in a case and a cover, the case, the cover, and the circuit board have been jointly screwed and fixed. For example, an electronic device includes a base and a cover that are fixed to each other through a fixing mechanism, and a circuit board is housed therein. The circuit board has a through hole through which at least a part of the fixing mechanism is inserted. The circuit board is fixed together with the base and the cover that are fixed to each other by the fixing mechanism.

SUMMARY

One aspect of the present disclosure is a rotary actuator used in a shift-by-wire system for a vehicle. The actuator includes a motor, a case, a controller, a cover, and a cover fixing member. The case houses the motor. The controller is disposed in an opening of the case and controls the motor. The cover closes the opening of the case. The cover fixing member fixes the cover to the case. The cover fixing member fixes the cover to the case at a position outside of a board of the controller. The board is clamped between the cover and the case.

DETAILED DESCRIPTION

Hereinafter, a plurality of embodiments of a rotary actuator (hereinafter, actuator) will be described with reference to the drawings. In the embodiments, substantially the same components are denoted by the same reference numerals and description thereof is omitted.

To begin with, relevant technologies will be described first only for understanding the following embodiments. In a rotary actuator, a difference in linear expansion coefficient among the circuit board, the case, and the cover would generate a dimensional difference between the pitch between the through holes of the circuit board and the pitch between the cover and the fixing mechanism of the base. Such a dimensional difference is generated particularly when the cover or the base is made from resin or when a larger circuit board is used. Due to this dimensional difference, stress in a board extending direction arises in the circuit board, the cover, and the base. Thus, there is a concern that the cover or the base may be damaged or a solder portion of the circuit board may be cracked.

The present disclosure has been made in view of the above, and the following embodiments of the present disclosure will be presented to provide a rotary actuator as an example that prevents the cover or the case from being damaged and prevents a solder portion of the board from being cracked.

As describe above, one aspect of the present disclosure is a rotary actuator used in a shift-by-wire system for a vehicle. The actuator includes a motor, a case, a controller, a cover, and a cover fixing member. The case houses the motor. The controller is disposed in an opening of the case and controls the motor. The cover closes the opening of the case. The cover fixing member fixes the cover to the case. The cover fixing member fixes the cover to the case at a position outside of a board of the controller. The board is clamped between the cover and the case.

Accordingly, the board of the controller is not directly fastened to both the cover and the case by the cover fixing member, but is just clamped by the cover and the case at a position inwardly away from the cover fixing member in an extending direction of the board. Therefore, stress in the board extending direction can be restricted from generating in the board, the cover, and the case. Therefore, it is possible to prevent the cover or the case from being damaged and to prevent a solder portion of the board from being cracked.

First Embodiment

In this embodiment, an actuator is used as a driver of a shift-by-wire system for a vehicle.
(Shift-by-Wire System)

Figure 1:
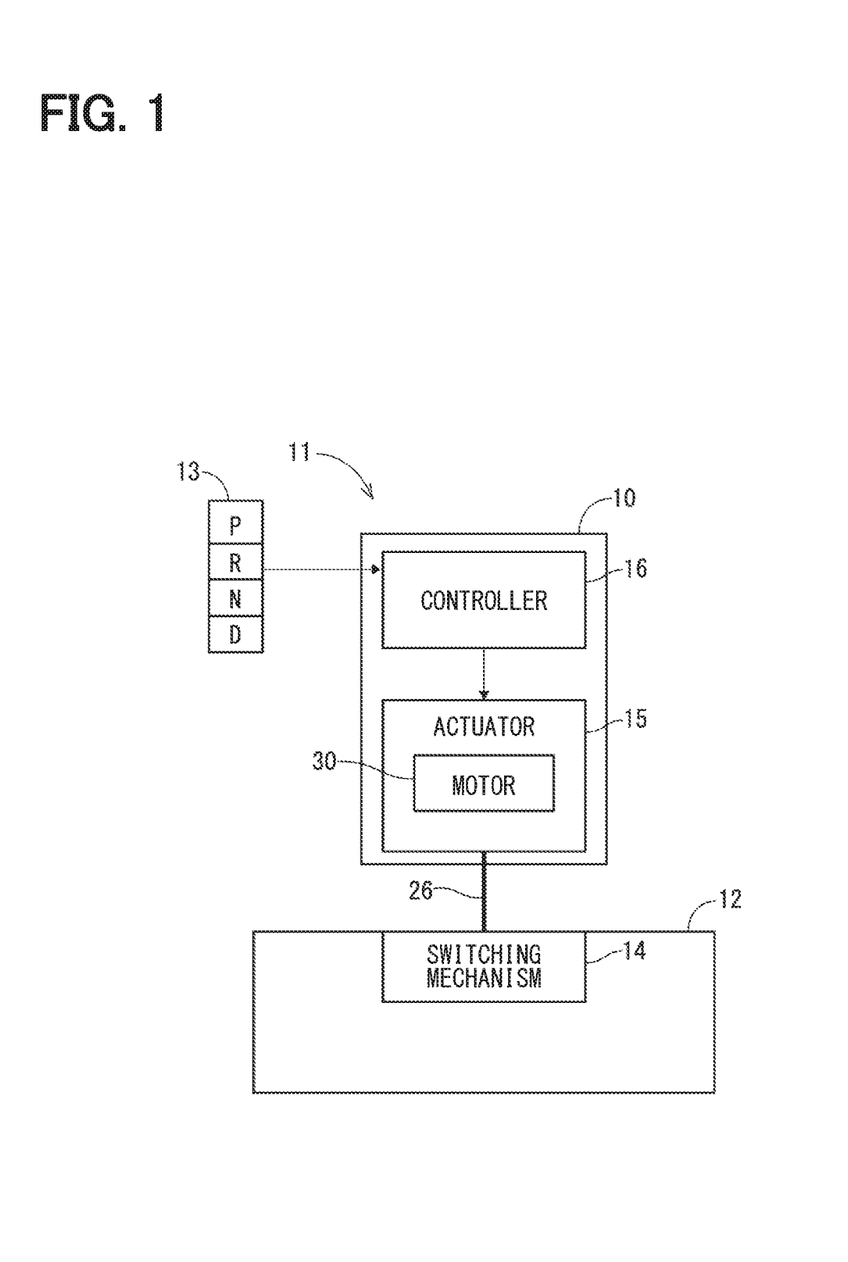
FIG. 1 is a schematic diagram showing a shift-by-wire system to which a rotary actuator according to a first embodiment is applied.

The configuration of the shift-by-wire system will be described with reference to FIGS. 1 and 2. As shown in FIG. 1, the shift-by-wire system 11 includes a shift operation device 13 that outputs an instruction (i.e., a command signal) to designate a shift range to the transmission 12 and an actuator 10 that operates a shift range switching mechanism 14 of the transmission 12. The actuator 10 includes an operating unit 15 that has a motor 30 and a controller 16 that controls the motor 30 in response to a shift range instruction signal.

Figure 2:
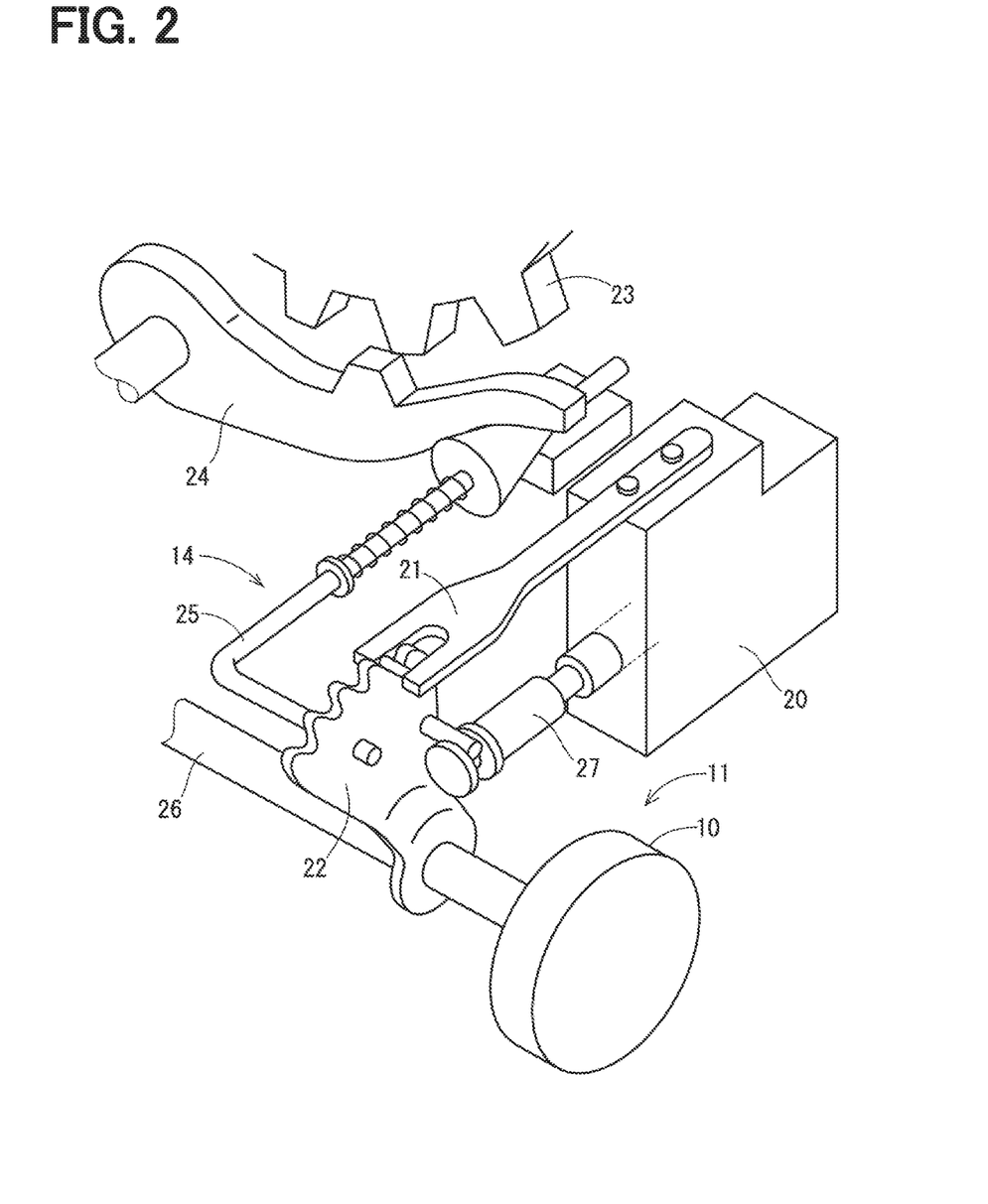
FIG. 2 is a diagram illustrating a shift range switching mechanism of FIG. 1.

As shown in FIG. 2, the shift range switching mechanism 14 includes a range switching valve 20, a detent spring 21 and a detent lever 22, a park pole 24, and a manual shaft 26. The range switching valve 20 controls a supply of hydraulic pressure to a hydraulic operating mechanism in the transmission 12 (see FIG. 1). The detent spring 21 and a detent lever 22 are configured to keep a shift range. The park rod 25 is configured to prevent an output shaft from rotating by fitting the park pole 24 into a park gear 23 of the output shaft of the transmission 12 when the shift range is switched to a parking range. The manual shaft 26 rotates together with the detent lever 22.

The shift range switching mechanism 14 rotates the detent lever 22 together with the manual shaft 26 to move a valve body 27 and the park rod 25 of the range switching valve 20 connected to the detent lever 22 to a position corresponding to a target shift range. In the shift-by-wire system 11, the actuator 10 is connected to the manual shaft 26 in order to perform the shift range change electrically.

(Actuator)

Figure 3:
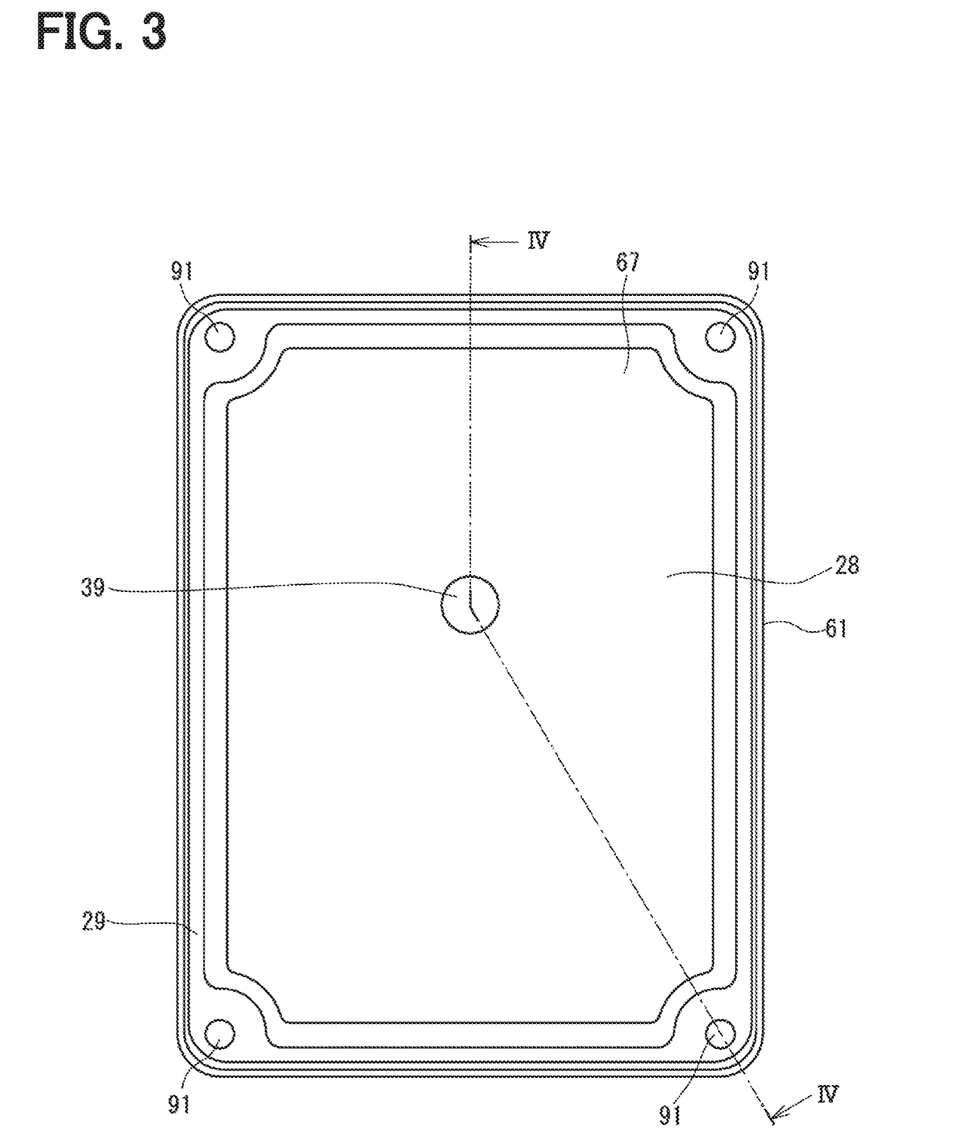
FIG. 3 is a plane view of the rotary actuator of FIG. 1.
Figure 4:
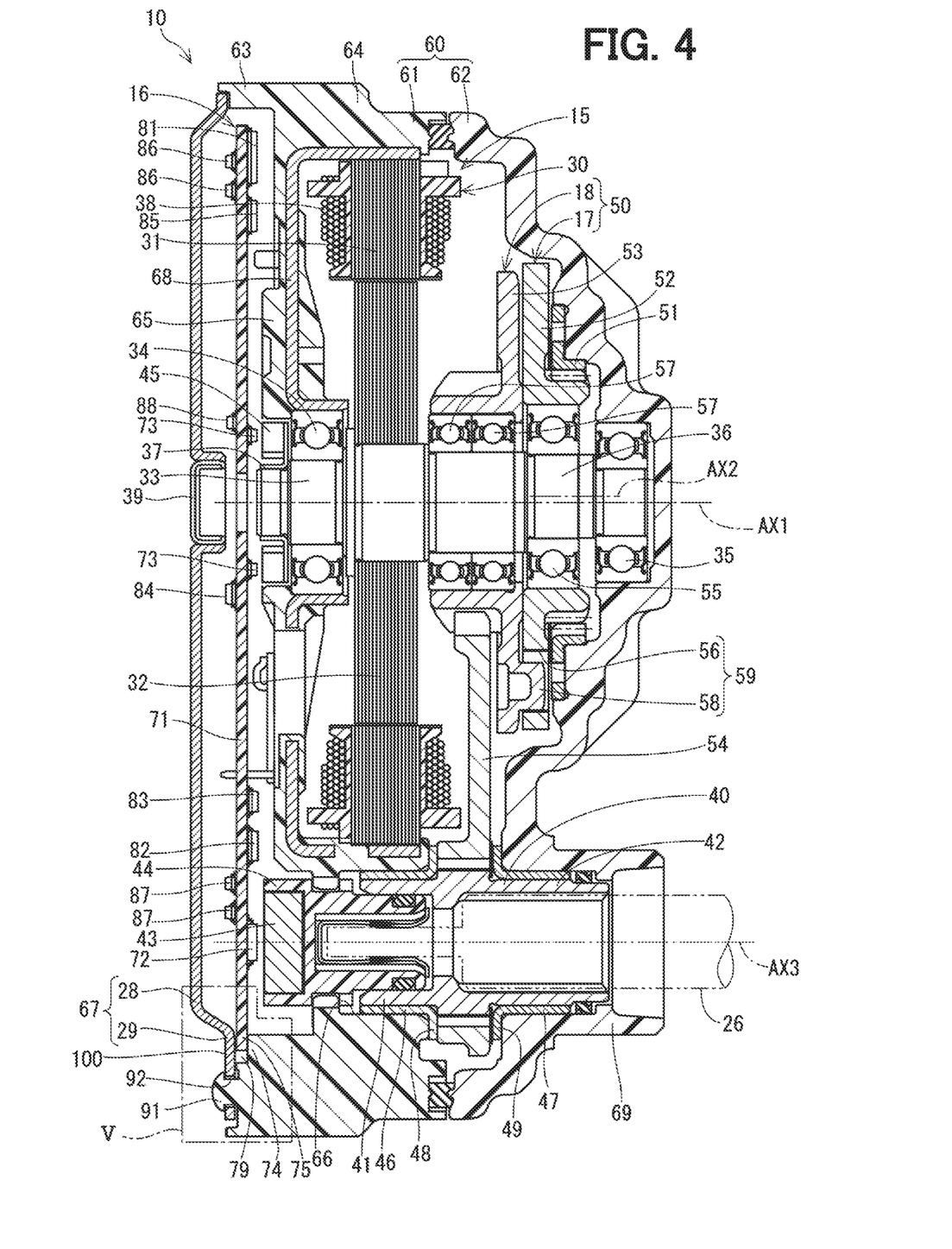
FIG. 4 is a cross-sectional view taken along IV-IV line in FIG. 3.

Next, the configuration of the actuator 10 will be described. As shown in FIGS. 3 and 4, the actuator 10 is an electromechanical integrated actuator including the operating unit 15 and the controller 16 in a case 60.

The case 60 includes a cylindrical upper case portion 61 and a cup-shaped lower case portion 62. One end 63 of the upper case 61 defines an opening of the case 60. A partition 65 is formed between one end 63 and the other end 64 of the upper case 61. A board 71 is disposed inside of the one end 63. The board 71 is covered by a plate cover 67 provided at the opening of the one end 63, thereby ensuring shielding for the board 71. The lower case 62 is attached to the other end portion 64. Further, the lower case 62 includes a cylindrical protrusion 69 that protrudes away from the upper case 61. The manual shaft 26 is inserted into the cylindrical protrusion 69.

The operating unit 15 includes the motor 30 as a driving power generator, an output shaft 40 arranged in parallel with the motor 30, and a speed-reducing mechanism 50 that reduces a rotational speed of the motor 30 and transmits the rotation to the output shaft 40.

The motor 30 includes a stator 31 press-fitted into, and fixed to, a plate case 68 at the other end 64, a rotor 32 provided inside the stator 31, and a motor shaft 33 that rotates about a rotation axis AX1 together with the rotor 32. The motor shaft 33 is rotatably supported by both a bearing 34 disposed in the plate case 68 and a bearing 35 disposed in the lower case portion 62. Further, the motor shaft 33 has an eccentric portion 36 eccentric with the rotation axis AX1 at a position on a side of the rotor 32 close to the lower case portion 62. The motor 30 is able to rotate bidirectionally by controlling a current supplied to the coil 38 by the controller 16 and is also able to stop at desired rotational positions. A plug 39 is attached to a through hole of the plate cover 67. If a failure occurs, the motor shaft 33 can be forcibly rotated manually after detaching the plug 39.

The speed-reducing mechanism 50 has a first speed-reducing portion 17 including a ring gear 51 and a sun gear 52 and a second speed-reducing portion 18 including a drive gear 53 and a driven gear 54 as parallel shafts type gears. The ring gear 51 is coaxially disposed with the rotation axis AX1. The sun gear 52 is rotatably supported about the eccentric axis AX2 by a bearing 55 that is fitted into the eccentric portion 36. The sun gear 52 meshes with, and fits snugly inside, the ring gear 51. When the motor shaft 33 rotates, the sun gear 52 performs planetary motion in which the sun gear 52 revolves around the rotation axis AX1 and rotates about the eccentric axis AX2. At this time, the rotational speed of the sun gear 52 is reduced relative to the rotational speed of the motor shaft 33. The sun gear 52 has a hole 56 for rotation transmission.

The drive gear 53 is provided on the rotation axis AX1 and is rotatably supported about the rotation axis AX1 by a bearing 57 fitted into the motor shaft 33. Further, the drive gear 53 has a protrusion 58 for rotation transmission that is inserted into the hole 56. The rotation of the sun gear 52 is transmitted to the drive gear 53 through engagement between the hole 56 and the protrusion 58. The hole 56 and the protrusion 58 constitute a transmission mechanism 59. The driven gear 54 is provided on the rotation axis AX3 which is parallel to the rotation axis AX1 and coaxial with the cylindrical protrusion 69. The driven gear 54 meshes with the drive gear 53 to circumscribe the drive gear 53. When the drive gear 53 rotates about the rotation axis AX1, the driven gear 54 rotates about the rotation axis AX3. At this time, the rotational speed of the driven gear 54 is reduced relative to the rotational speed of the drive gear 53.

The output shaft 40 has a cylindrical shape, and is provided coaxially with the rotation axis AX3. The partition 65 has a through support hole 66 coaxial with the rotation axis AX3. The output shaft 40 is rotatably supported about the rotation axis AX3 by a first flanged bush 46 fitted into the through support hole 66 and a second flanged bush 47 fitted inside the cylindrical protrusion 69. The driven gear 54 is a separate component from the output shaft 40, is fitted outwardly to the output shaft 40, and is connected to the output shaft 40 to transmit rotation. The manual shaft 26 is inserted into the output shaft 40, and is coupled to the output shaft 40 through, for example, spline fitting so as to transmit rotation.

One end 41 of the output shaft 40 is rotatably supported by the first flanged bush 46. The other end 42 of the output shaft 40 is rotatably supported by the second flanged bush 47. The driven gear 54 is supported in the axial direction by being clamped between a first flange portion 48 of the first flanged bush 46 and a second flange portion 49 of the second flanged bush 47. In another embodiment, the driven gear 54 may be supported in the axial direction by being clamped between a pair of supporting portions such as the case 60 and another plate.

The controller 16 includes a plurality of electronic components for controlling the motor 30, the board 71 on which the electronic components are implemented, an output shaft position detection sensor 72 implemented on the board 71, and a motor position detection sensor 73 implemented on the board 71.

The plurality of electronic components include a microcomputer 81, a MOSFET 82, a capacitor 83, a diode 84, an ASIC 85, an inductor 86, a resistor 87, a capacitor chip 88, and the like.

The output shaft position detection sensor 72 is disposed on the board 71 at a position facing the magnet 43. The magnet 43 is fixed to a holder 44 attached to the output shaft 40. The output shaft position detection sensor 72 detects a rotational position of the output shaft 40 and the manual shaft 26 rotating together with the output shaft 40 by detecting a magnetic flux generated by the magnet 43.

The motor position detection sensor 73 is disposed on the board 71 at a position facing the magnet 45. The magnet 45 is fixed to a holder 37 attached to the motor shaft 33. The motor position detection sensor 73 detects a rotational position of the motor shaft 33 and the rotor 32 by detecting a magnetic flux generated by the magnet 45.

(Upper Case and Plate Cover)

Next, the configuration of a cover fixing member 91 for fixing a plate cover 67 to the upper case 61 and the peripheral parts thereof will be described. As shown in FIG. 3, the actuator 10 has a plurality of cover fixing members 91 provided at a circumferential edge portion of the plate cover 67. As shown in FIGS. 3 and 4, the plate cover 67 has a cover convex 28 protruding away from the board 71 and a cover concave 29 recessed toward the board 71. The cover concave 29 extends to surround the plate cover 67.

Figure 5:
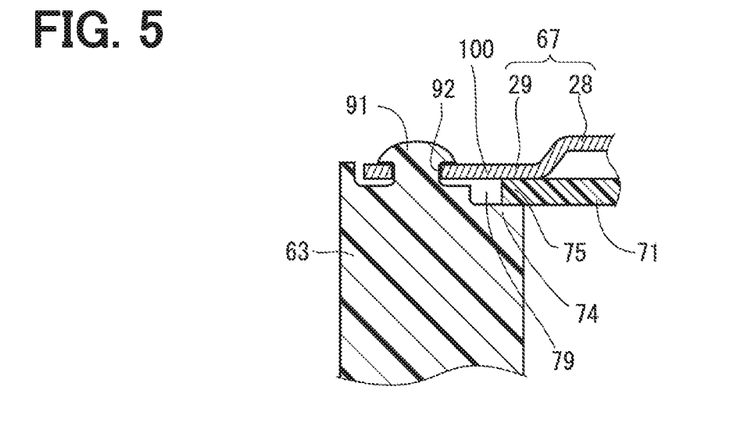
FIG. 5 is an enlarged view of V part in FIG. 4.

As shown in FIGS. 4 and 5, the one end 63 includes the cover fixing members 91 and a support member 74. The support member 74 supports an outer edge 75 of the board 71. The support member 74 is recessed toward the lower case 62 from the cover fixing member 91 in a direction perpendicular to a board extending direction along which the board 71 extends. The outer edge 75 of the boar 71 is clamped between the cover concave 29 and the support member 74. The cover fixing members 91 fix the cover concave 29 to the one end 63 at positions outside of the board 71 in the board extending direction of the board 71. A gap 79 is formed between the outer edge 75 and the one end 63 in the board extending direction of the board 71.

Each of the cover fixing members 91 is a heat waging fixing means provided at the one end 63. The cover concave 29 defines holes 92 through which the cover fixing members 91 are inserted. The distal end of the cover fixing member 91 is heat waged. The cover concave 29 is fixed to the one end 63 by the cover fixing members 91 through heat waging.

The cover concave 29 includes elastic portions 100 each having an elastic property in a direction perpendicular to the board extending direction of the board 71. Each of the elastic portions 100 is located between the corresponding cover fixing member 91 and the cover convex 28.

As described above, the rotary actuator 10 has the cover fixing members 91 that fix the plate cover 67 to the case 60. The cover fixing member 91 fixes the plate cover 67 to the case 60 at positions outside of the board 71 in the board extending direction of the board 71. The board 71 is clamped between the plate cover 67 and the case 60.

Accordingly, the board 71 is not fastened to the plate cover 67 and the case 60 directly by a fixing member, but is just clamped by the plate cover 67 and the case 60 at a position inwardly away from the cover fixing members 91 in the board extending direction of the board 71. Thus, the board 71 does not need holes for the cover fixing members 91. Therefore, stress in the board extending direction to the substrate 71, the plate cover 67, and the case 60 can be restricted from generating. Therefore, it is possible to prevent the plate cover 67 or the case 60 from being damaged and to prevent a solder portion of the board 71 from being cracked.

In the first embodiment, the gaps 79 are formed between the board 71 and the one end 63 in the board extending direction of the board 71. The cover concave 29 includes elastic portions 100 having an elastic property in a direction perpendicular to the board extending direction of the board 71. Each of the elastic portions 100 is located between the corresponding cover fixing member 91 and the cover convex 28. The elastic portions 100 allow the board 71 to move relative to the plate cover 67 and the case 60 while clamping the board 71. The gaps 79 and the elastic portions 100 can mitigate thermal expansion and thermal contraction of the board 71.

Further, the board 71 is clamped at the outer edge 75 of the board 71. The outer edge 75 of the board 71 cannot be used as an area for mounting and wiring electronic components. Therefore, there is no need to additionally secure an area in the board 71 to be clamped. Thus, it is possible to suppress an increase in the size of the board 71.

The cover fixing member 91 is a heat waging fixing member provided at the one end 63. Therefore, it is not necessary to additionally prepare another member for fixing the board 71.

Second Embodiment

Figure 6:
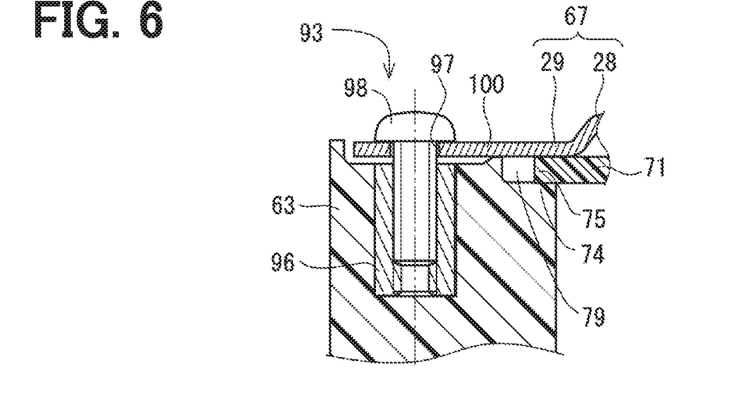
FIG. 6 is a cross-sectional view of a cover fixing member according to a second embodiment.

The second embodiment is the same as the first embodiment, except for the following configuration. As shown in FIG. 6, each of the cover fixing members 93 is a fastening member formed of a male screw 98 and a female screw 96. The plate cover 67 has holes 97 through which the male screws 98 are inserted. The female screws 96 are insert nuts embedded in the one end 63 by insert molding. Each of the male screws 98 passes through the corresponding hole 97 from the plane side of the plate cover 67 and is screwed into the corresponding insert nut (the female screw 96).

Since the cover fixing member 93 is a fastening member formed of the male screw 98 and the female screw 96, the plate cover 67 can be firmly fixed by an axial force. Further, since the female screw 96 is an insert nut, the weight of the female screw 96 can be reduced. That is, while the plate cover 67 is firmly fixed by screwing, most of the one end 63 can be made of resin, thereby reducing its weight. With the cover fixing members 93 as described above, the same advantages as that of the first embodiment can be obtained because the cover 79 has the gap 79 and the elastic portions 100 and a fixing hole is not formed in the board 71.

Third Embodiment

Figure 7:
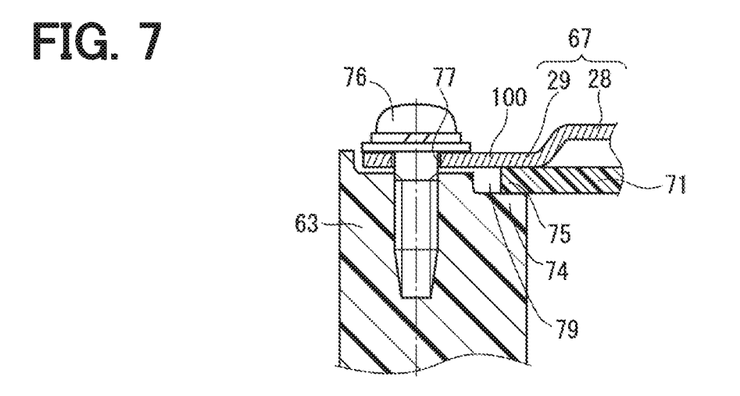
FIG. 7 is a cross-sectional view of a cover fixing member according to a third embodiment.

The third embodiment is the same as the first embodiment, except for the following configuration. As shown in FIG. 7, each of the cover fixing members 76 is a tapping screw. The plate cover 67 defines holes 77 through which the cover fixing members 76 are inserted. Each of the cover fixing members 76 passes through the hole 77 from the plane side (an upper side) of the plate cover 67 and is directly screwed into the one end 63.

The cover fixing members 76 do not require the insert or press-fitting for the nut. With the cover fixing members 76 as described above, the same advantages as that of the first embodiment can be obtained because the cover 79 has the gap 79 and the elastic portions 100 and a fixing hole is not formed in the board 71.

Fourth Embodiment

Figure 8:
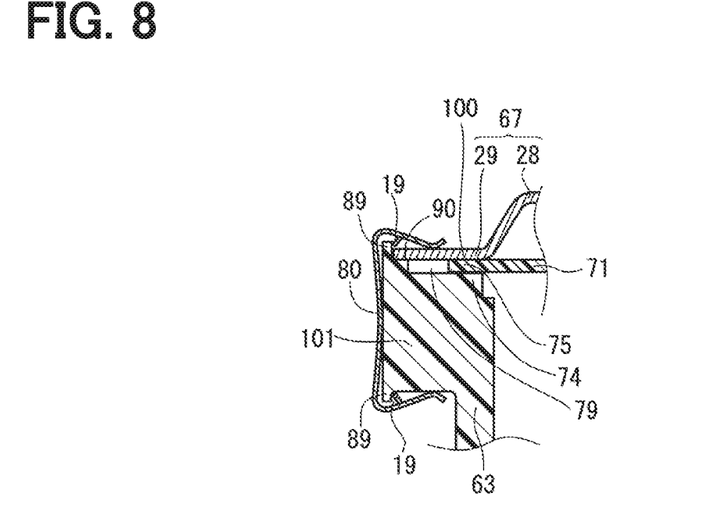
FIG. 8 is a cross-sectional view of a cover fixing member according to a fourth embodiment.

The fourth embodiment is the same as the first embodiment, except for the following configuration. As shown in FIG. 8, each of the cover fixing members 80 is a clip. The cover fixing member 80 clamps the one end 63 and the plate cover 67 in a direction perpendicular to the board extending direction. At the four corners of the one end 63 as viewed from the opening of the case 60, case convenes 101 are provided to protrude toward an outside of the one end 63. The cover fixing member 80 clamps the cover concave 29 and the case convex 101.

Two cover protrusions 89 are formed on both sides of the case convex 101 in a direction perpendicular to the board extending direction. A portion of the one end 63 at which the plate cover 67 is in contact with the one end 63 in a direction perpendicular to the board extending direction is defined as a contact portion 90. In the direction perpendicular to the board extending direction, the contact portion 90 is recessed toward the lower case 62 from the cover protrusion 89 close to the plate cover 67. The support member 74 is recessed toward the lower case 62 from the contact portion 90 in the direction perpendicular to the board extending direction. The cover fixing member 80 fixes the cover concave 29 to the one end 63 at a position outside of the board 71 in the board extending direction. In the board extending direction, the contact portion 90 is located further away from the cover fixing member 80 with respect to the board 71. In the board extending direction, the cover protrusions 89 are located further away from the board 71 than the cover fixing members 80. The contact portion 90 and the support member 74 are a part of the case convex 101.

Because of the cover fixing members 80, the cover concave 29 can include the elastic portions 100 having an elastic property in a direction perpendicular to the board extending direction. Two clip protrusions 19 are formed in the cover fixing member 80. The clip protrusions 19 are stoppers that engage with the cover protrusions 89.

The cover fixing member 80 does not require the insert or press-fitting for a fixing means. In addition, it is possible to avoid a decrease in the axial force due to the creep of the one end 63. With the cover fixing member 80 as described above, the same advantages as that of the first embodiment can be obtained because the cover 79 has the gap 79 and the elastic portion 100, and a fixing hole is not formed in the board 71.

Fifth Embodiment

Figure 9:
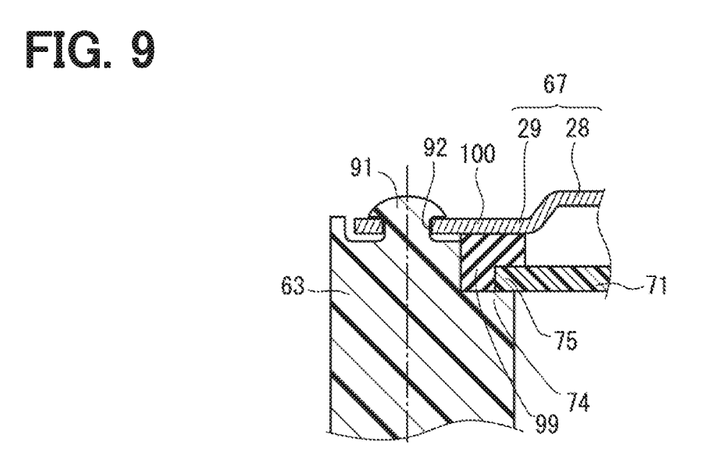
FIG. 9 is a cross-sectional view of a cover fixing member according to a fifth embodiment.

The fifth embodiment is the same as the first embodiment, except for the following configuration. As shown in FIG. 9, a rubber member 99 is clamped between the cover concave 29 and the support member 74 and between the cover concave 29 and the outer edge 75 of the board 71 in a direction perpendicular to the board extending direction. In the board extending direction, the rubber member 99 is disposed between the one end 63 and the outer edge 75. That is, when a portion of the board 71 at which the board 71 is clamped between the case 60 and the plate cover 67 is defined as a clamped portion, then the rubber member 99 is provided between the plate cover 67 and the clamped portion. The gap 79 described in the first embodiment is replaced with the rubber member 99 in this embodiment. Then, the rubber member 99 is clamped between the elastic portion 100 and the outer edge 75. The rubber member 99 buffers the displacement of the board 71. Therefore, it is possible to further reduce the stress in the board 71 while obtaining the same advantages as in the first embodiment.

Sixth Embodiment

Figure 10:
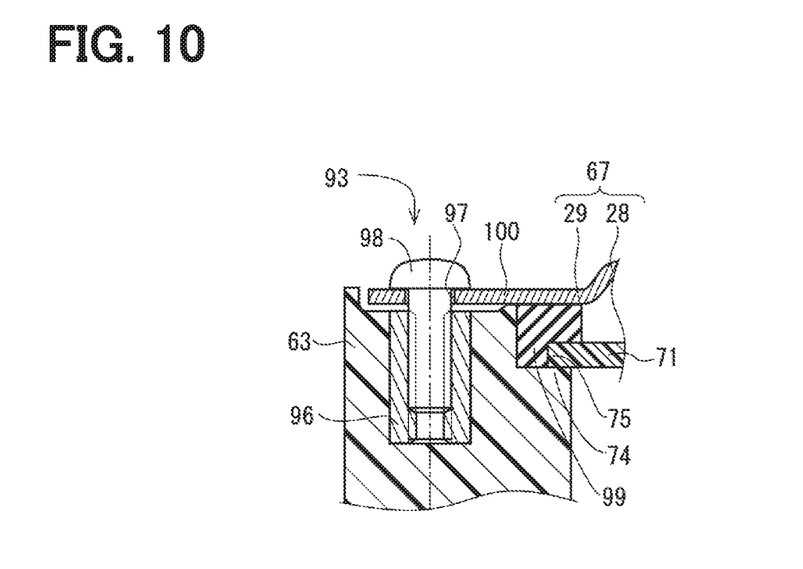
FIG. 10 is a cross-sectional view of a cover fixing member according to a sixth embodiment.

The sixth embodiment is the same as the second embodiment, except for the following configuration. As shown in FIG. 10, a rubber member 99 is clamped between the cover concave 29 and the support member 74 and between the cover concave 29 and the outer edge 75 in a direction perpendicular to the board extending direction. In the board extending direction, the rubber member 99 is disposed between the one end 63 and the outer edge 75. That is, when a portion of the board 71 at which the board 71 is clamped between the case 60 and the plate cover 67 is defined as a clamped portion, then the rubber member 99 is provided between the plate cover 67 and the clamped portion. The gap 79 described in the second embodiment is replaced with the rubber member 99 in this embodiment. Then, the rubber member 99 is clamped between the elastic portion 100 and the outer edge 75. The rubber member 99 buffers the displacement of the board 71. Therefore, it is possible to further reduce the stress to the board 71 while obtaining the same advantages as in the second embodiment.

Seventh Embodiment

Figure 11:
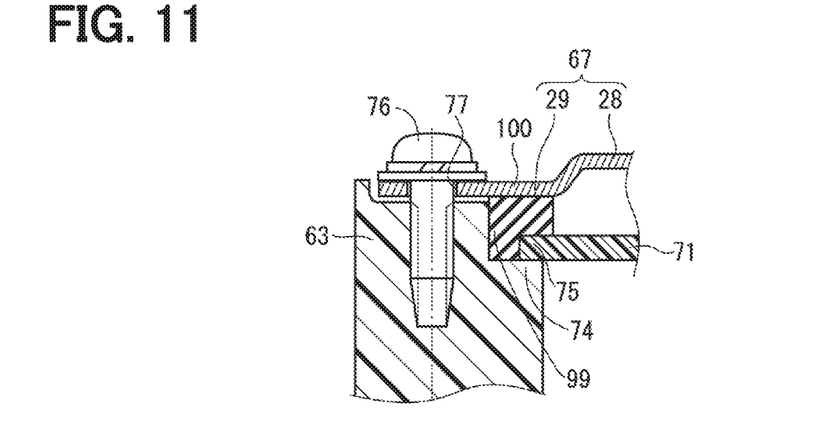
FIG. 11 is a cross-sectional view of a cover fixing member according to a seventh embodiment.

The seventh embodiment is the same as the third embodiment, except for the following configuration. As shown in FIG. 11, a rubber member 99 is clamped between the cover concave 29 and the support member 74 and between the cover concave 29 and the outer edge 75 in a direction perpendicular to the board extending direction of the board 71. In the board extending direction, the rubber member 99 is disposed between the one end 63 and the outer edge 75. That is, when a portion of the board 71 at which the board 71 is clamped between the case 60 and the plate cover 67 is defined as a clamped portion, then the rubber member 99 is provided between the plate cover 67 and the clamped portion. The gap 79 described in the third embodiment is replaced with the rubber member 99 in this embodiment. Then, the rubber member 99 is clamped between the elastic portion 100 and the outer edge 75. The rubber member 99 buffers the displacement of the board 71. Therefore, it is possible to further reduce the stress to the board 71 while obtaining the same advantages as in the third embodiment.

OTHER EMBODIMENTS

In another embodiment, in a direction perpendicular to the board extending direction, the rubber member is not necessarily limited to be clamped between the elastic portion and the outer edge. For example, the rubber member may be clamped between the support member and the outer edge. Alternatively, they may be clamped by both. That is, any structure can be used as long as the displacement of the board is buffered.

In another embodiment, the method for fixing the cover fixing member is not necessarily limited to heat swaging, screw fastening, a tapping screw or a clip. In short, any fixing method can be used as long as the cover fixing member fixes the cover concave to the one end at a position outside of the board in the board extending direction.

In another embodiment, the plate cover is not necessarily limited to the structure having one cover fixing member at each of the four corners, but may have, for example, one cover fixing member on each of four sides of the plate cover, or may have a plurality of cover fixing members at each corner or each side of the plate cover.

In another embodiment, the female screw is not necessarily limited to the insert nut, and may be, for example, a press-fitted nut.

In another embodiment, the clip may not necessarily clamp in a direction perpendicular to the board extending direction. In short, any configuration may be used as long as the clip clamps one end of the upper case and the plate cover, and the cover fixing member fixes the cover concave to the one end at a position outside of the board in the board extending direction.

In another embodiment, the fixing through hole formed in the plate cover is not necessarily limited to a hole, and may be, for example, a notch.

In another embodiment, the elastic member is not necessarily limited to a rubber member, and may be, for example, a synthetic resin having elasticity. In short, the elastic member may be any member as long as it can buffer the displacement of the board of the controller.

The present disclosure is not necessarily limited to the embodiments described above, and can be implemented in various forms without departing from the spirit of the invention.

The invention claimed is:

1. A rotary actuator used in a shift-by-wire system for a vehicle, the actuator comprising:
   a motor;
   a case that houses the motor;
   a controller that is disposed in an opening of the case and controls the motor;
   a cover that closes the opening of the case; and a cover fixing member that fixes the cover to the case, wherein the opening of the case is confined solely within the case;

the cover fixing member fixes the cover to the case at a position outside of a board of the controller, and the board is clamped by and between the cover and the case.

2. The rotary actuator according to claim 1, wherein an outer edge of the board is clamped between the cover and the case.

3. The rotary actuator according to claim 1, wherein the cover fixing member is a heat swaging fixing member provided in the case.

4. The rotary actuator according to claim 1, wherein the cover fixing member includes a female screw that is provided in the case and a male screw that passes through the cover and is screwed into the female screw.

5. The rotary actuator according to claim 4, wherein the female screw is a nut fixed to the case.

6. The rotary actuator according to claim 1, wherein the cover fixing member is a tapping screw that passes through the cover and is screwed into the case.

7. The rotary actuator according to claim 1, wherein the cover fixing member is a clip that clamps the case and the cover.

8. The rotary actuator according to claim 1, wherein the board includes a clamped portion clamped by the case and the cover, and the rotary actuator further comprises an elastic member disposed between the case and the clamped portion or between the cover and the clamped portion.

9. A rotary actuator used in a shift-by-wire system for a vehicle, the actuator comprising:

a motor;

a case that houses the motor;

a controller that is disposed in an opening of the case and controls the motor;

a cover that closes the opening of the case; and a cover fixing member that fixes the cover to the case, wherein the cover fixing member fixes the cover to the case at a position outside of a board of the controller, the board is clamped between the cover and the case;

the board includes a clamped portion clamped by the case and the cover, and the rotary actuator further comprises an elastic member disposed between the case and the clamped portion or between the cover and the clamped portion.

* * * * *